United States Patent [19]

Plagens

[11] Patent Number: 5,055,768

[45] Date of Patent: Oct. 8, 1991

[54] TEMPERATURE COMPENSATOR FOR HALL EFFECT CIRCUIT

[75] Inventor: Mark R. Plagens, Richardson, Tex.

[73] Assignee: Honeywell Inc., Minneapolis, Minn.

[21] Appl. No.: 505,710

[22] Filed: Apr. 5, 1990

[51] Int. Cl.⁵ .............................................. G05F 1/567
[52] U.S. Cl. ..................................... 323/368; 307/309; 323/907; 324/225
[58] Field of Search ................. 330/256; 323/368, 907; 307/309; 324/117 H, 225

[56] References Cited

U.S. PATENT DOCUMENTS

| | | | |
|---|---|---|---|
| 4,134,030 | 1/1979 | Pace | 307/309 |
| 4,521,727 | 6/1985 | Atherton et al. | 323/294 |
| 4,734,594 | 3/1988 | Nelson | 307/309 |
| 4,760,285 | 7/1988 | Nelson | 307/309 |
| 4,833,406 | 5/1989 | Foster | 324/225 |
| 4,908,527 | 3/1990 | Van Antwerp | 307/309 |

*Primary Examiner*—William H. Beha, Jr.
*Attorney, Agent, or Firm*—William D. Lanyi

[57] ABSTRACT

A resistor formed in the same epitaxial layer of semiconductor material in which a Hall element is formed is used to provide a temperature dependent voltage source which is inversely proportional to the resistance of a temperature sensitive load resistor on the Hall element output. A current mirror circuit is used to apply a current proportional to the current through the epitaxial layer resistor to the load resistor so that the voltage across through the load resistor varies in a direct relationship with the sensitivity of the Hall element.

5 Claims, 2 Drawing Sheets

TEMPERATURE COMPENSATOR FOR HALL EFFECT CIRCUIT

FIELD OF THE INVENTION

This invention relates to methods for compensating for the effect of temperature on temperature sensitive electronic devices. More particularly, it relates to methods and circuitry for compensating for the temperature dependence of sensitivity of Hall effect elements and other devices having similar characteristics.

BACKGROUND OF THE INVENTION

The Hall effect is widely used in devices intended for measuring, controlling and regulating purposes. For example, in combination with a voltage amplifier, a Hall effect element may be used as a stable signal generator or as a switch or boundary value indicator which functions without physical contact.

The theory of operation of Hall effect devices is well known. A block or sheet of suitable material having orthogonal axes X, Y and Z is fitted with a pair of input electrodes such that a current flows along the X axis and, if a magnetic field is passed through the material generally parallel with the Y axis, then a Hall voltage will be produced across the material in the direction of the Z axis. A pair of output electrodes may be connected to the material such that the Hall voltage can be applied to an output circuit.

Materials suitable for Hall effect devices generally exhibit large increases in resistance with increasing temperature. Thus, a fixed voltage applied to a Hall or other similar element results in a current therethrough which decreases rapidly with increasing temperature. As a result of the decreasing current the output voltage of the Hall element decreases. This large negative temperature coefficient is manifested as a reduction in sensitivity as temperature increases. In many applications a large variation in sensitivity cannot be tolerated or is at least undesirable. In such applications it is necessary to provide means for compensating for the temperature dependence.

A variety of circuits and apparatus have been devised for compensating for the temperature dependent characteristics of a Hall element. For example, British Pat. No. 1,247,955 discloses Hall effect apparatus in which an attempt is made to provide temperature independent sensitivity, in part by maintaining a constant current through a Hall element by connecting large value resistors in series therewith. The apparatus also includes an output circuit in which the internal resistance of the Hall element forms part of a feedback network for a differential amplifier.

A more practical and widely accepted method for temperature compensation of Hall effect circuits is shown in U.S. Pat. No. 4,521,727 to Atherton, et al. Through use of compensation threshold voltage directly proportional to the current flowing through the Hall element, a magnetic switch point is achieved which is dependent only on the Hall scattering coefficient which has a temperature coefficient of about +700ppm/° C. Key to this method, however, is the use of a resistance element which is temperature independent. Unfortunately, temperature independent resistors such as CrSi thin film resistors must be formed during the circuit fabrication process by process steps not ordinarily employed in manufacturing the Hall element device and associated circuitry. Thus the cost of making such temperature compensated circuits is greatly increased because of the time and expense involved in making the required temperature independent resistor.

The sensitivity of a Hall element can be expressed as:

$$S_H = \frac{V_H}{B_Z} = \frac{r_n}{qt(N_D)}(G_T)(I_Y)$$

wherein:
$B_Z$ = Magnetic induction perpendicular to plane of the sensor
q = Charge on the electron
$N_D$ = N-type carrier density in the Hall element
t = Thickness of the Hall element
$V_H$ = Hall voltage
$I_Y$ = Current in the Hall element
$G_T$ = Hall element geometry factor $$r_n = \frac{\text{Hall mobility}}{\text{Drift mobility}} = \frac{\mu'_n}{\mu_n}$$

The current in the Hall element can be expressed as $$I_Y = \frac{V_a}{R_H}$$

wherein:
$V_a$ = Voltage across Hall element
$R_H$ = Impedance of Hall element.
Impedance of the Hall element may be expressed as:

$$R_H = \left(\frac{\rho}{t}\right)\left(\frac{L}{W}\right)$$

wherein:
$\rho$ = Resistivity
L = Length
W × Width
Since:

$$\frac{\rho}{t} = \frac{1}{(q\mu_n)(N_D)(t)}$$

Hall sensitivity may be expressed as:

$$S_H = \frac{V_H}{B_Z} = (\mu'_n)(G_T)(V_a)\left(\frac{W}{L}\right)$$

Thus Hall sensitivity is directly proportional to the bias voltage applied to the Hall element and proportional to Hall mobility. Since drift mobility is directly related to Hall mobility, a control element responsive to drift mobility changes with temperature can be used to accurately determine changes in sensitivity under conditions where $V_a$ is held constant.

SUMMARY OF THE INVENTION

In accordance with the invention, a resistor is formed in the same epitaxial layer in which the Hall element is formed. Since this resistor is directly thermally coupled to the Hall element, temperature changes which affect the Hall element also affect this resistor and its resistance will be directly related to temperature sensitivity of the Hall element. The voltage across the Hall element is maintained constant and resistance changes in the epitaxial resistor used to control a reference current applied to a load resistor used to measure Hall output. The load resistor, of course, is temperature sensitive. By allowing the reference voltage across the epitaxial resistor to vary with absolute temperature and inversely proportionally to the load resistor, a temperature dependent voltage directly related to Hall sensitivity is produced. The product of this reference voltage and the resistance of the load resistor thus can be made constant with temperature to produce a temperature independent resistor reference.

All components of the temperature compensation circuit can be formed on the same chip as the Hall element by conventional integrated circuit diffusion and masking techniques, thus additional costly fabrication steps are avoided. Furthermore, the components of the temperature compensation circuit can be fabricated with trimmable resistors and alternative interconnection arrangements so that the circuit can be selectively arranged to provide constant sensitivity with temperature, increasing sensitivity with increasing temperature, or decreasing sensitivity with increasing temperature. Similarly, configuration options can be included in the circuit fabrication to permit selection of bipolar or unipolar operation. Other features and advantages of the invention will become more readily understood from the following detailed description taken in connection with the appended claims and attached drawing in which:

DETAILED DESCRIPTION

Figure 1:
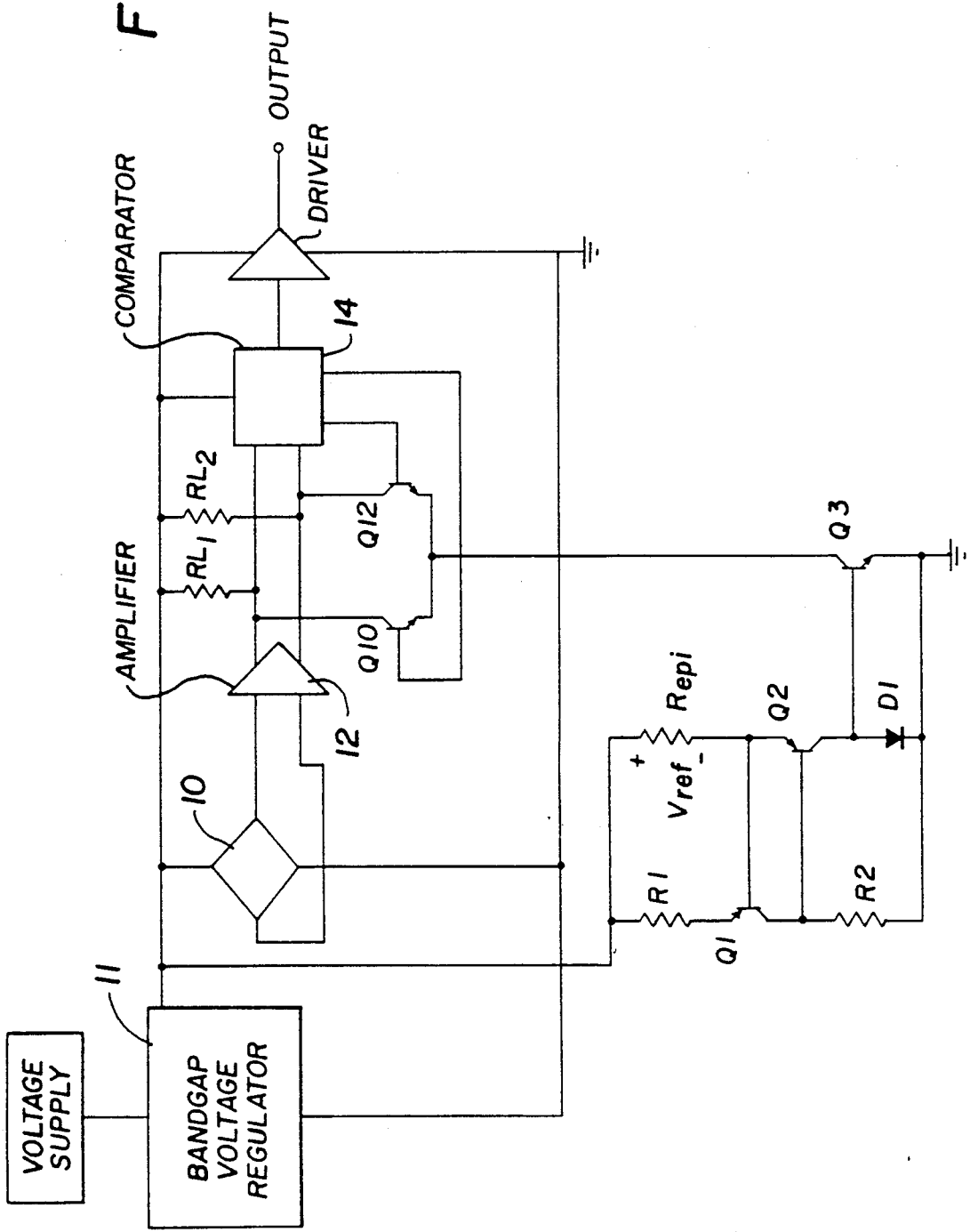
FIG. 1 is a schematic illustration of the preferred embodiment of the invention configured for bipolar operation.

A diagrammatic representation of a bipolar circuit employing the principles of the invention is shown in FIG. 1. A constant bias voltage which is independent of temperature is supplied to a Hall effect device 10 by a bandgap voltage regulator 11 from an external voltage supply. The output of Hall element 10 in response to a magnetic field is amplified by a constant gain amplifier 50 and thus appears across load resistors $RL_1$ and $RL_2$.

The embodiment of FIG. 1 is a bipolar latch circuit which turns on (operates) at a predetermined magnitude and direction of magnetic field and turns off (releases) at the same magnitude but opposite direction of magnetic field. A differential transistor switch (not shown) is used to change the comparator threshold polarity and alternately switches transistors Q10 and Q12 on and off to switch a reference current ($I_{ref}$) on the collector of Q10 or Q12, respectively, to load resistors $RL_1$ or $RL_2$, respectively.

The reference current ($I_{ref}$) is determined by a current mirror circuit comprising transistors Q1, Q2 and Q3; resistors $R_1$, $R_2$ and $R_{epi}$ and diode D1. It will be recognized that by appropriate selection of the values of resistors R1 and R2, the current (or any function thereof) passing through resistor $R_{epi}$ appears as the current ($I_{ref}$) on the collector of transistor Q3.

The circuit of FIG. 1 is a bipolar latch circuit designed to operate at a given magnetic threshold irrespective of temperature changes. At the point $B_{op}$ where the magnetic field is sufficient:

$$(B_{op})(S_H)(A_V) = I_{ref}(RL)$$

where:

$B_{op}$ = Magnetic field required to operate the circuit
$A_V$ = Gain of amplifier
$S_H$ = Sensitivity of Hall element.

In accordance with the invention, resistor $R_{epi}$ is fabricated to the same epitaxial layer in which the Hall element is formed so that the mobility of electrons therein matches the drift mobility of the Hall element.

The resistance of $R_{epi}$ may be expressed as:

$$R_{epi} = \frac{1}{q(\mu_n)(N_D)t} \left( \frac{L1}{W1} \right)$$

The current $I_{ref}$ on the collector of transistor Q3 is:

$$I_{ref} = \frac{V_{ref}}{R_{epi}}$$

Thus:

$$B_{op} = \frac{1}{(S_H)(A_V)} \frac{(V_{ref})(RL)}{R_{epi}}$$

By producing a temperature dependent voltage source $V_{ref}$ which is inversely proportional to the resistance of the load resistor RL, the product of ($V_{ref}$)(RL) can be made constant with temperature. Thus, with amplifier gain $A_V$ constant with temperature:

$$B_{op} = \frac{C_1}{(S_H)(R_{pei})}$$

or $$B_{op} = (C_1) \frac{(q)(\mu_n)(N_D)(t)}{(\mu'_n)(G_T)(V_a)} \left( \frac{W}{L} \right) \left( \frac{W1}{L1} \right)$$

or

Thus, with $V_a$ constant and $V_{ref}$ proportional to $V_a$:

$$B_{op} = (C_2) \left( \frac{1}{r_n} \right)$$

The magnetic threshold, therefore, remains constant with temperature.

It will be observed that the temperature dependence of $V_{ref}$ is equal to the temperature dependence of $(1-2K)V_{BE}$ of transistor Q2 where $$K = \frac{R1}{R1 + R2}.$$

Thus the temperature dependent voltage (VL) across resistor RL is:

$$VL = \frac{V_{ref}RL}{R_{epi}} = \frac{\text{constant}}{R_{epi}}$$

Thus, VL is proportional to the resistivity of the epitaxial layer resistor so that VL tracks sensitivity of the Hall element.

It will be noted that the entire circuit can be formed on the same chip on which the Hall element is formed by relatively simply masking and diffusion techniques. Furthermore, the same masking and diffusion techniques which are used to ordinarily form the amplifier circuit will be used to form the additional components required for the temperature compensation circuit. Thus the effects of temperature change will be canceled and the need for a temperature independent resistor is totally eliminated.

It will be further noted that the values of resistors R1 and R2 can be made selectively variable by conventional trimming techniques. Thus, the values of resistors R1 and R2 can be selectively adjusted to provide a circuit in which the Hall effect sensitivity can increase with temperature, decrease with temperature, or be maintained relatively constant with temperature changes.

Figure 2:
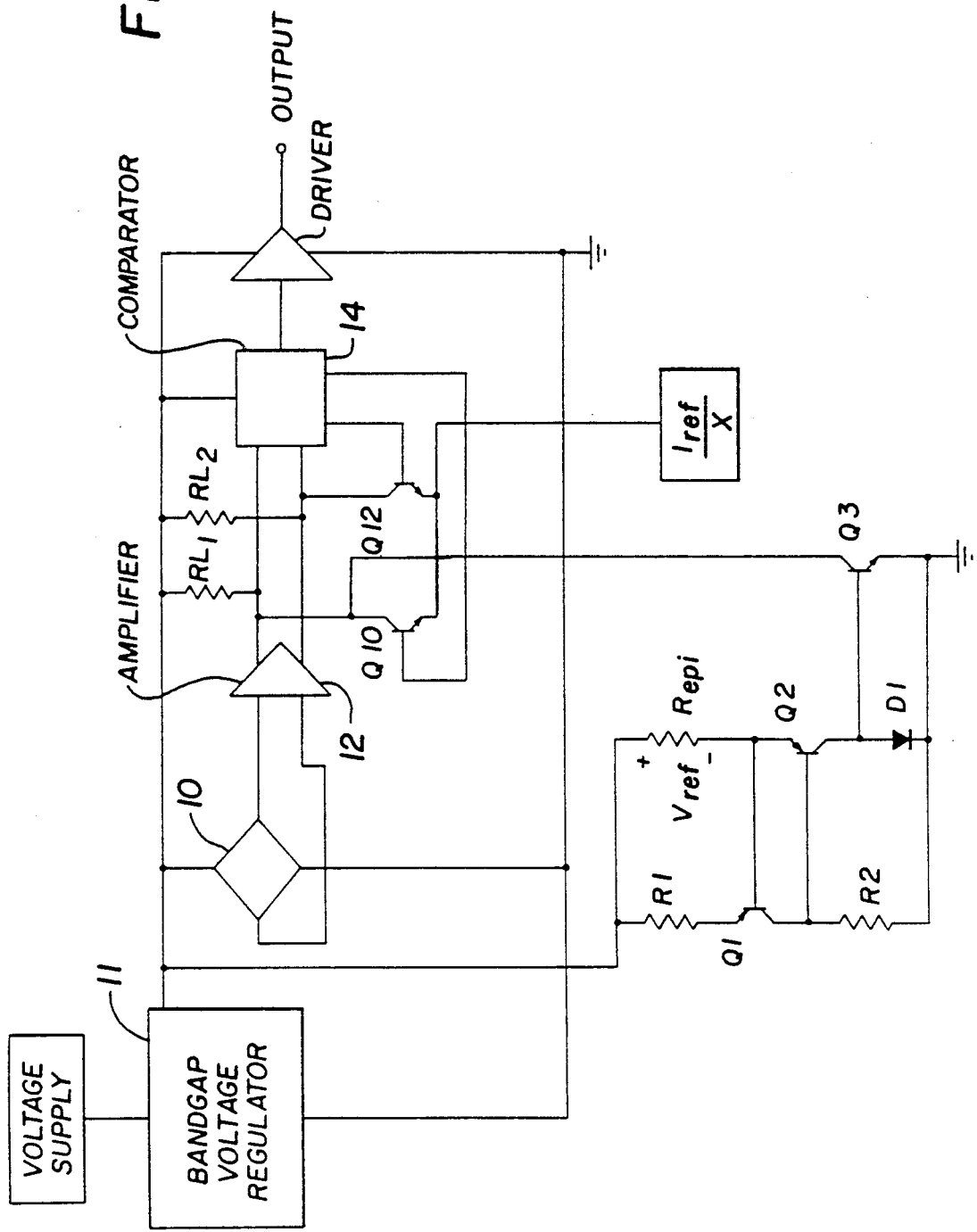
FIG. 2 is a schematic illustration of the preferred embodiment of the invention configured for unipolar operation.

An alternative embodiment of the invention is illustrated in FIG. 2 wherein the same principles are applied to provide unipolar operation so that the latching circuit turns on (operates) at a predetermined magnitude and direction of magnetic field and turns off (releases) at a predetermined lesser magnitude of the same direction of magnetic field. In this case the current $I_{ref}$ on the collector of transistor Q3 is applied directly to load resistor $RL_1$. When transistor Q12 is turned on, a fractional portion $$\left( \frac{I_{ref}}{X} \right)$$

which is proportional to the desired switching hysteresis is applied to resistor $RL_2$. Again, it will be noted that the entire circuitry for either unipolar or bipolar operation can be included in the manufacturing process and the desired operational configuration selected by convention interconnection selection techniques.

While the invention has been described with specific reference to compensating for the temperature dependence of Hall element sensitivity, it will be readily recognized that the principles thereof are equally applicable to other devices which are temperature sensitive. Similarly, although the invention is described in detail with reference to specific circuit arrangements, similar effects may be accomplished by use of other circuit arrangements. It is to be understood, therefore, that although the invention has been described with particular reference to specific embodiments thereof, the forms of the invention shown and described in detail are to be taken as preferred embodiments of same, and that various changes and modifications may be resorted to without departing from the spirit and scope of the invention as defined by the appended claims.

What is claimed is:

1. In a circuit for sensing the effect of a magnetic field on a Hall effect element formed in a layer of semiconductor material:
   (a) a temperature sensitive load resistor connected across the Hall element output;
   (b) means for providing a temperature sensitive voltage across a temperature sensitive reference resistor which is inversely proportional to a resistance of the temperature sensitive load resistor; and
   (c) current mirror circuit means for providing a current proportional to the current through the reference resistor to the temperature sensitive load resistor so that voltage across the load resistor varies with temperature in direct relationship with the sensitivity of the Hall effect element.

2. The circuit defined in claim 1 wherein said reference resistor is formed in the same layer of semiconductor material in which the Hall element is formed.

3. The circuit defined in claim 1, wherein:
   said load resistor comprises two resistors connected across the Hall element output.

4. A circuit for providing a temperature compensated output responsive to magnetic field strength, comprising:
   (a) a substrate of semiconductor material;
   (b) a temperature sensitive Hall effect element formed in said material having a pair of bias terminals and a pair of output terminals between which a Hall voltage is generated when said Hall effect element is subjected to a magnetic field;
   (c) power supply means having first and second terminals operatively connected across said bias terminals;
   (d) amplifier means operatively connected to said pair of output terminals to receive said Hall voltage, said amplifier means having first and second output terminals;
   (e) a first temperature sensitive load resistor connected between said first terminal of said power supply means and said first output terminal of said amplifier means;
   (f) a second temperature sensitive load resistor connected between said first terminal of said power supply means and said second output terminal of said amplifier means;
   (g) current mirror circuitry operatively connected between said first and second terminals of said power supply means including a temperature sensitive resistor, the resistance of which is proportional to the temperature sensitivity of said Hall effect element, and to a reference output terminal through which the current is proportional to the current through the reference resistor; and
   (h) switch means for alternately connecting said reference output terminal to said first and second output terminals of said amplifier means;
   whereby the voltage across said first and second temperature sensitive load resistors is inversely proportional to the resistance of said temperature sensitive reference resistor.

5. A circuit as defined in claim 4 wherein said temperature sensitive reference resistor is formed in a common epitaxial layer of semiconductor material with the Hall effect element.

* * * * *